(12) United States Patent
Tauchi et al.

(10) Patent No.: US 7,807,581 B2
(45) Date of Patent: Oct. 5, 2010

(54) PLASMA PROCESSING APPARATUS AND PLASMA PROCESSING METHOD

(75) Inventors: Susumu Tauchi, Shunan (JP); Akitaka Makino, Hikari (JP); Seiichi Watanabe, Hofu (JP); Naoki Yasui, Kudamatsu (JP)

(73) Assignee: Hitachi High-Technologies Corporation, Tokyo (JP)

( * ) Notice: Subject to any disclaimer, the term of this patent is extended or adjusted under 35 U.S.C. 154(b) by 464 days.

(21) Appl. No.: 11/683,014

(22) Filed: Mar. 7, 2007

(65) Prior Publication Data

US 2008/0217295 A1 Sep. 11, 2008

(51) Int. Cl.
  *H01L 21/302* (2006.01)
(52) U.S. Cl. .................. 438/714; 438/706; 438/712; 156/345.52
(58) Field of Classification Search ........... 438/706, 438/712, 714, 720, 710; 156/345.41, 52, 156/345.53
See application file for complete search history.

(56) References Cited

U.S. PATENT DOCUMENTS

| | | | | |
|---|---|---|---|---|
| 5,737,117 A | * | 4/1998 | Imaeda et al. | 359/332 |
| 6,103,631 A | * | 8/2000 | Soda et al. | 438/714 |
| 7,037,849 B2 | * | 5/2006 | Chiu et al. | 438/725 |
| 2005/0034674 A1 | * | 2/2005 | Ono | 118/728 |

FOREIGN PATENT DOCUMENTS

JP 2005-045126 2/2005

* cited by examiner

*Primary Examiner*—Lan Vinh
(74) *Attorney, Agent, or Firm*—Antonelli, Terry, Stout & Kraus, LLP.

(57) ABSTRACT

The present invention provides a plasma processing apparatus or a plasma processing method that can etch a multilayer film structure for constituting a gate structure with high accuracy and high efficiency. A plasma processing method of, on processing a sample on a sample stage 112 in a depressurized discharge room 117, etching a multilayer film (including a high-k and a metal gate) at 0.1 Pa or less and with the sample stage 112 temperature-regulated by using a pressure gauge 133 to be used for pressure regulation and connected to the processing room and a main pump for exhaustion 130.

7 Claims, 4 Drawing Sheets

PLASMA PROCESSING APPARATUS AND PLASMA PROCESSING METHOD

BACKGROUND OF THE INVENTION

1. Field of the Invention

The present invention relates to a plasma processing apparatus or a plasma processing method for processing a semiconductor wafer 212 by using plasma to form a wiring structure of a semiconductor device, and in particular, to the plasma processing apparatus or processing method for etching a film structure having films of multiple layers, i.e. films for insulating upper and lower films for forming the wiring structure placed on a surface of the semiconductor wafer 212 put on a sample stage placed in a vacuum vessel which is rendered low-pressure.

2. Description of the Related Art

In recent years, there has been great progress in the trend toward higher integration of semiconductor integrated circuit devices. As for MOS (Metal Oxide Semiconductor) type semiconductor devices, elements such as transistors are becoming miniaturized and higher-performance. In particular, a gate insulating film as one of the elements constituting a MOS structure is rapidly becoming thinner to cope with miniaturization, fast operation and lowered voltage of the transistors.

As for a material constituting the gate insulating film, a silicon dioxide film (SiO2 film) has been conventionally used. On the other hand, if the gate insulating film further becomes thinner in conjunction with miniaturization of gate electrodes, a tunneling current generated by direct tunneling of carriers (electrons and holes) through the gate insulating film, i.e. a gate leakage current increases. For instance, a film thickness of the gate insulating film required by a device of a 130-nm node is 2 nm or so in the case of the SiO2 film. However, this area is the area where the tunneling current starts to flow. Therefore, in the case where the $SiO_2$ film is used as the gate insulating film, the gate leakage current cannot be controlled so that power consumption increases.

Thus, a research is underway to use a material of higher permittivity as the gate insulating film instead of the SiO2 film. As for an insulating film of high permittivity (hereinafter referred to as a high-k film or a hi-k film), a TiO2 film, a Ta2O5 film and an Al2O5 film were conventionally considered. Recently, an HfO2 film, an HfAlOx film, an HfSiOx film and the like are receiving attention because of excellent stability on silicon.

Conditions for processing such a high-k film are disclosed in Japanese Patent Laid-Open Publication No. 2005-45126 (Patent Document 1) for instance. The conventional technology thereby disclosed specifies a range of gas composition and plasma density when etching a film structure composed of a resist pattern, an antireflection film, a silicon (polysilicon) film, a high-k film, an insulating film (SiO2 film) and the like formed on a silicon substrate by using gases including BC 13 and Ar so as to suppress side etching of the silicon film for a gate and improve accuracy of its shape.

In the case of the conventional technology, however, sufficient consideration was not given to a condition for stably performing the processing and thereby improving reproducibility although it disclosed the condition for improving controllability of the shape by etching a multilayer film including high-k. For instance, attention was not sufficient as to pressure in a processing room and a temperature condition of a sample, a sample stage and a member constituting the processing room when processing a substrate-like sample such as a semiconductor wafer 212 put on a platform in the processing room which is placed in a vacuum vessel.

To be more specific, the temperature condition on the processing is strict as to the film structure using the multilayer film for forming the miniaturized wiring structure such as a high-k and metal gate film. Unless the processing is performed while precisely realizing these, an etching rate or accuracy of the shape becomes low so that processing efficiency and yield will be damaged. This is because these film materials have lower reactivity than the silicon (polysilicon) film which is a film for realizing a conventional gate structure. To improve processing speed by increasing the reactivity, it is inevitable to increase the temperature on the surface of the sample being processed.

When the processing was performed by raising the temperature on the surface of the sample, there was a problem that a photoresist film as a mask placed over the film to be the film structure deteriorated by softening, deformation or the like so that functions as the mask lowered and the shape could not be realized with high accuracy. Furthermore, when high-frequency power supplied to the electrodes in the sample stage for the sake of forming a bias potential is increased in order to raise the temperature for the purposes of increasing the processing speed and improve controllability of the shape, there was a problem that charging damage on the film structure increases during the processing or etching of the upper mask increases.

Furthermore, when performing the processing as the film structure including the film composed of high-melting metal materials, reaction products including chemical compounds of these materials generated then reattach to the surfaces of members constituting inner walls of the processing room and become accumulated in the case where the temperature of the processing room is lower than the temperature of k and the surface of the sample. As for the accumulated products, there is a possibility that they are peeled off by change of the temperature or an interaction with plasma and attach to the surface of the sample to be a foreign substance. Therefore, it becomes necessary to suppress the attachment of the products. To be more specific, it is necessary to raise the temperature of the inner walls of the processing room to be higher than the temperature of the sample stage. In the case of performing the processing at high temperature to improve the efficiency as described above, however, it requires a structure for further raising the temperature of the inner walls of the processing room so that the structure of the processing device becomes larger and more complicated, resulting in higher manufacturing costs. In the case where an outer surface of the vacuum vessel exceeded 50° C., there was a problem that it required facilities for safety as well as installation of a heat insulating material therefor so that extra facilities are required and installation space is required, leading to increased installation costs.

An object of the preset invention is to provide a plasma processing apparatus or a plasma processing method that can etch a multilayer film structure for constituting the gate structure with high accuracy and high efficiency or to provide a plasma processing apparatus of a simple configuration at low cost.

SUMMARY OF THE INVENTION

The object is achieved by (same as what is claimed is).

DETAILED DESCRIPTION OF THE PREFERRED EMBODIMENTS

Hereunder, embodiments of the preset invention will be described by using the drawings.

First Embodiment

Figure 1:
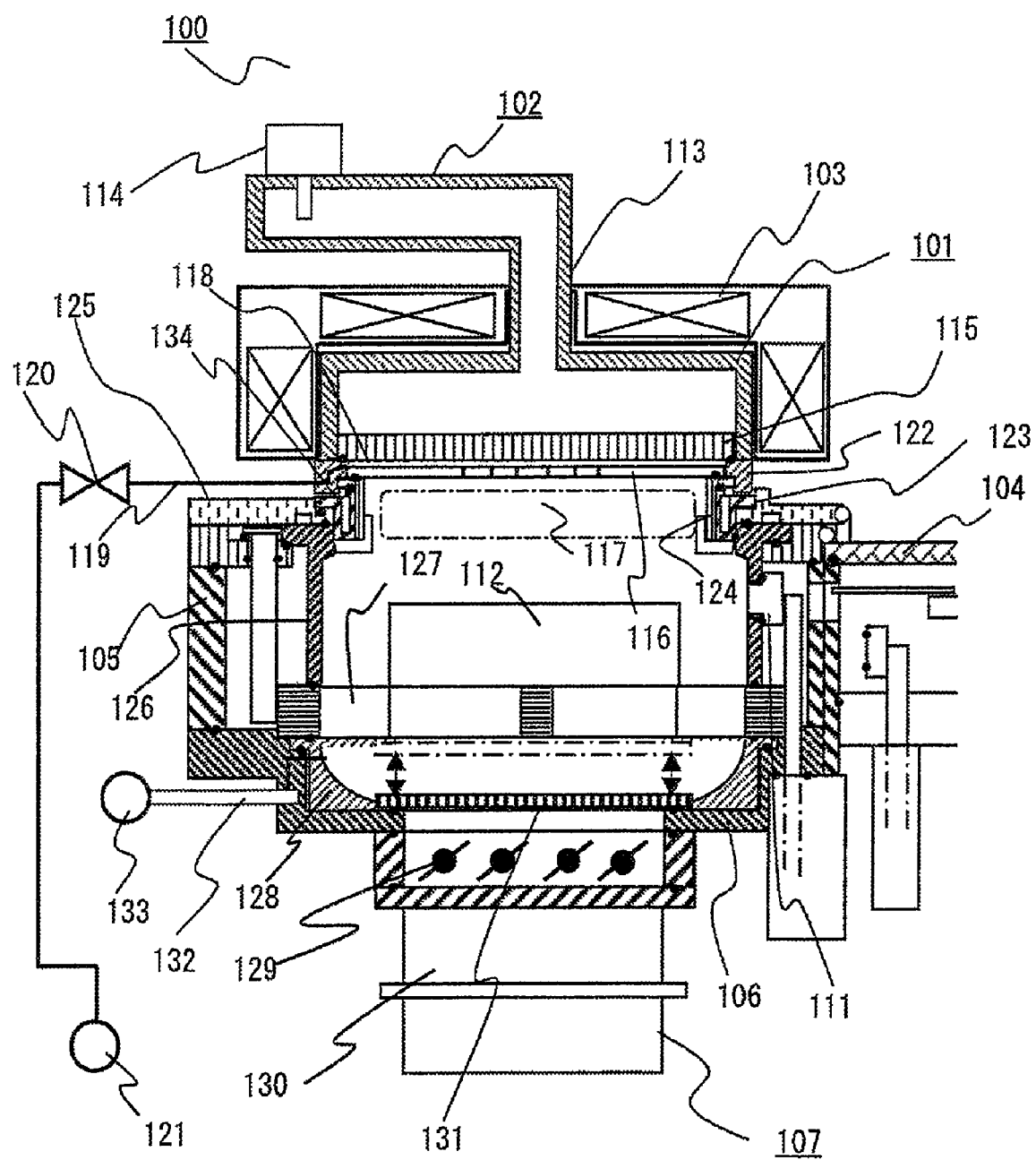
FIG. 1 is a sectional view showing an overview of a configuration of an embodiment related to a plasma processing apparatus of the present invention.

A processing chamber of this embodiment will be described by using FIG. 1. FIG. 1 is a longitudinal section showing an overview of a configuration of the embodiment related to a plasma processing apparatus of the present invention.

In FIG. 1, a plasma processing apparatus 100 includes a vacuum vessel 101, electromagnetic wave supply means provided in an upper part thereof and evacuation means 107 placed in a lower part of the vacuum vessel 101. Furthermore, the vacuum vessel 101 has a processing room placed therein, which is approximately cylindrical space for processing a processing subject sample inside it and has its side wall portion as an approximately rectangular plane coupled with a vacuum transport container 104 for transporting a sample in depressurized internal space.

The processing room in the vacuum vessel 101 is connected to a transport room placed inside the vacuum transport container 104, and is opened and blocked during or after the processing by opening and closing means described later. To be more specific, they are communicated or blocked off by an air gate valve 111 which opens and closes and is placed between them. With the gate valve 111 opened, the space inside the transport room and the space inside the processing room communicate so that their pressures become approximately equal. When the gate valve 111 is open, a wafer as a sample is transported on a sample stage 112 placed in the processing room from inside the transport room and mounted thereon.

The electromagnetic wave supply means provided in the upper part of the vacuum vessel 101 includes means for generating a radio wave of a predetermined frequency and supplying an electric field in the processing room and means composed of a solenoid coil 103 and the like and generating a magnetic field and supplying a magnetic field. The means for supplying an electric field of this embodiment has a waveguide 113 placed above a member constituting a ceiling plane of the vacuum vessel 101 and a magnetron 114 for plasma excitation installed at an end of the waveguide 113, where a microwave is generated by the magnetron 114 and led in the waveguide 113 toward the processing room. Furthermore, a ceiling member of the processing room which is a lower end of the waveguide 113 includes a plate 115 composed of a dielectric such as quartz for conducting a transmitted microwave to the inside of the processing room below and a shower plate 116 placed below the quartz plate and having multiple holes formed thereon for dispersedly introducing a supplied process gas for processing inside the processing room.

The space formed below the shower plate 116 and above the sample stage 112 is a discharge room 117 in which plasma is formed by an interaction between the radio wave introduced to the supplied process gas through the quartz plate 115 and the magnetic field supplied from a magnetic field generating portion. Furthermore, space is formed between the quartz plate 115 and the shower plate 116 with a minute clearance. The process gas to be supplied to the discharge room 117 is supplied first to this space, and flows into the discharge room 117 through the above holes penetrating the shower plate 116 and communicating this space with the discharge room 117. The space is a buffer room 118 provided so that the process gas dispersedly flows into the discharge room 117 from multiple holes. The process gas is supplied from a controller 121 for adjusting supply of fluids such as a gas to the processing chamber via a process gas line 119 and a process gas cutoff valve 120.

Thus, the process gas is dispersedly introduced into the discharge room 117 from multiple holes, and the holes are mainly placed at positions opposed to the position at which the sample is placed on the sample stage 112 so as to uniform plasma density in conjunction with a function of the buffer room 118 capable of dispersing the gas to be more uniform. A lower ring 122 is placed on a peripheral side of the quartz plate 115 and the shower plate 116. Inside the lower ring 122, there is a gas passage communicated with the gas line 119 through which the process gas flows to the buffer room 118.

Furthermore, below the shower plate 116, a discharge room outer wall member 123 and an inner wall member 124 are placed forming the discharge room 117 by facing the plasma inside the vacuum vessel and in contact with the lower ring 122 and the shower plate 116 on their undersides. The inner wall member 124 and the outer wall member 123 are each in an approximately cylindrical shape and almost concentrically configured in this embodiment. The outer wall member 123 is placed with a heater 134 wound around its peripheral surface, where the temperature of the outer wall member 123 is regulated so as to regulate surface temperature of the inner wall member 124 having contacted it.

The outer wall member 123 has a discharge room base plate 125 placed on its peripheral side in contact with its underside. The underside of the discharge room base plate 125 is in contact with a vacuum chamber portion placed below it. The inner wall member 124 is a member for acting as a ground electrode to the plasma inside the discharge room 117 and the sample stage 112 which plays a role of an electrode, and has necessary area for stabilizing a plasma potential. It is necessary, for the sake of the action as the ground electrode, to sufficiently secure heat conduction as well as conductivity between the inner wall member 124 and the outer wall member 123 or the lower ring 122 to be in contact and in connection with.

According to this embodiment, the surface temperature of the walls constituting the vacuum chamber is regulated so as to adjust the interaction among their surfaces, plasma and particles, gases and a residue included therein. And their temperature is kept higher than the temperature of the sample stage. It is possible to put plasma characteristics such as plasma density and composition in a desired state by thus adequately adjusting the interaction between the plasma and the walls of the vacuum chamber facing it.

Below the discharge room base plate 125, the processing chamber is formed by placing a lower case wall 15 constituting the lower part of the vacuum vessel, a bottom case wall 16 connected thereto from below and constituting the bottom of the vacuum vessel, an internal lower chamber 128, an internal chamber 126 placed therein and coupled with the discharge room base plate 125 with its top surface in contact with the underside of the discharge room base plate 125, and an electrode base 127 as multiple beams for connecting with the lower part of the internal chamber 126 and supporting the sample stage 112 in the space in the processing room.

An evacuation device 107 for adjusting exhaustion inside the vacuum vessel is placed in the lower part of the bottom case wall 16. In this embodiment, the evacuation device 107 is provided with a flow regulating valve 129 placed at the center of the internal lower chamber 128 and the bottom case wall 16 to adjust cross-section area of an opening for exhausting the gas in the processing room and thereby adjust an amount and speed of the exhaustion with multiple rotating plate-like flaps placed in a passage below and communicated with the opening, an exhaustion line communicated with an exit of the passage and composed of a main pump 130 such as a turbo-molecular pump for exhausting the gas in the processing room, and a valve plate 131 placed in the processing room and blocking off the lower part of the opening.

A piping 132 connected to the processing room is provided with a pressure gauge 133 to be used for pressure regulation of the processing room. As for the main pump 130 and pressure gauge 133, those capable of achieving 0.1 Pa or less are selected.

Figure 2:
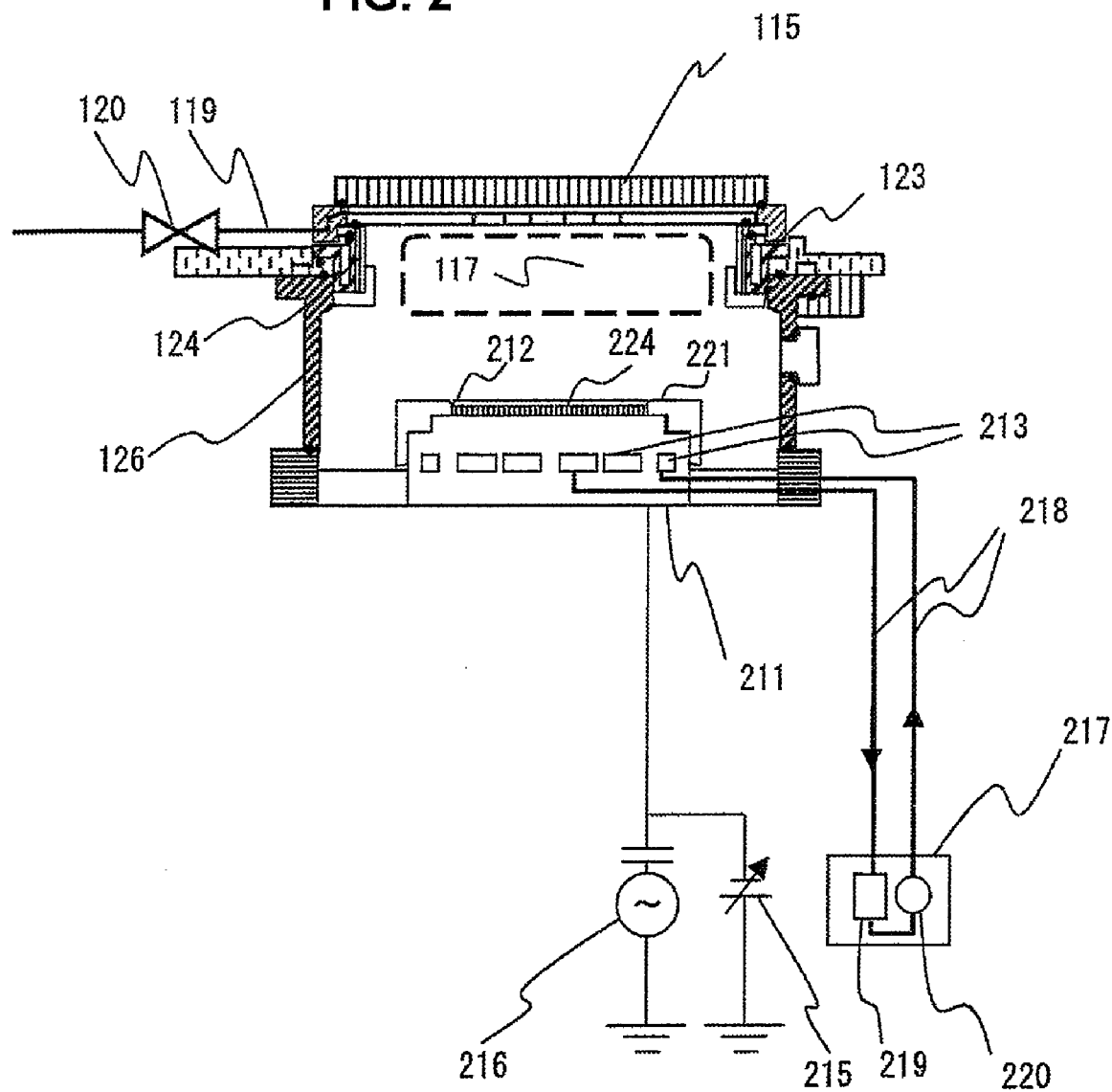
FIG. 2 is a schematic diagram showing an enlarged configuration of a periphery of a sample stage of the embodiment shown in FIG. 1.

FIG. 2 shows details of the periphery of the sample stage 112. FIG. 2 is a longitudinal section showing an enlarged overview as to a configuration of the periphery of the sample stage in the embodiment shown in FIG. 1. Inside a bottom electrode 211 composed of a conductive member placed inside the sample stage 112, there is provided a groove 213 for circulating a refrigerant for the purpose of temperature regulation of a semiconductor wafer 212 as a processing subject to be processed by the plasma formed in the discharge room 117. The groove 213 for the refrigerant is connected with a circulation temperature regulator 217 for temperature regulation via a flexible tube 218 for connection. The circulation temperature regulator 217 has a temperature regulating portion 219 composed of a heat exchanger and a refrigerator for temperature regulation and a circulating pump 220 built therein.

A dielectric film 214 for electrostatic absorption is provided on a top surface of the sample stage 112, which causes the semiconductor wafer 212 to be electrostatically absorbed to the bottom electrode 211 by using an electrostatic absorption direct-current power source 215 connected to the bottom electrode 211 so as to perform the temperature regulation. A high-frequency power source 216 for exerting reaction control over an etching material on the surface of the semiconductor wafer 212 is connected in parallel with the electrostatic absorption direct-current power source 215. A cover 221 is provided on the top side surface in order to protect the surface of the bottom electrode 211 other than the semiconductor wafer 212.

The semiconductor wafer 212 as a processing subject sample transported inside the transport room of the depressurized vacuum transport container 104 by a robotic arm in the transport room is delivered on the sample stage 112 and is put on the top surface of the sample stage 112 in the processing room depressurized equally to the inside of the transport room by operation of the evacuation device 107. The semiconductor wafer 212 put thereon is put on the dielectric film 214 and absorptively retained on the top surface of the dielectric film 214 by the electrode in the dielectric film 214 to which power from the electrostatic absorption direct-current power source 215 is supplied.

As for the process gas introduced into the discharge room 117 in this state, an interaction arises between an electric field due to a microwave propagated by transmitting through the quartz plate 115 and the shower plate 116 and the magnetic field supplied from the solenoid coil 103 to excite the process gas so that the plasma is generated in the discharge room 117. The semiconductor wafer 212 on the sample stage 112 is processed by using the plasma. High-frequency power of a predetermined frequency is supplied from the high-frequency power source 216 to the bottom electrode 211 composed of the conductive member placed inside the sample stage 112 during the processing. And a desired bias potential is generated on the surface of the semiconductor wafer 212, and charged particles in the plasma are attracted to the surface of the semiconductor wafer 212 so as to promote the processing and realize a desired processed shape.

During the processing, the inner wall member 124 of the discharge room 117 is maintained at predetermined temperature by the heater 134. The evacuation device 107 is in operation even during the processing, and maintains the inside of the processing room at a predetermined pressure value by discharging the supplied process gas and plasma out of the processing room together with the products generated in conjunction with the processing.

Figure 3A:
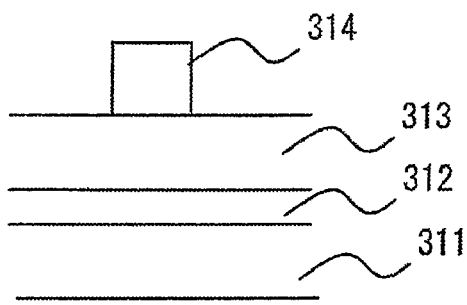
FIG. 3 are schematic diagrams of a film structure for realizing a wiring structure of a semiconductor device which is a subject of the embodiment shown in FIG. 1.

FIG. 3 show a film structure as a wiring structure for the semiconductor device which is a subject of the plasma processing of the present invention. FIG. 3A is a schematic diagram showing an unprocessed state of the film structure formed on the surface of the semiconductor wafer 212 as the processing subject. In FIG. 3A, the film structure has a silicon substrate 311 as a lower base, and a high-k film 312 and a gate film 313 to be a gate of the semiconductor device placed in this order over it, and a patterned oxide film 314 to be a mask further over them. Here, the gate film 313 is composed of a simple or a compound film composed of high-melting metal materials such as Ti, Ni, Mo, Ru, Hf, Ta, W, Re, Ir, Pt, La, Eu and Yb.

Figure 4A:
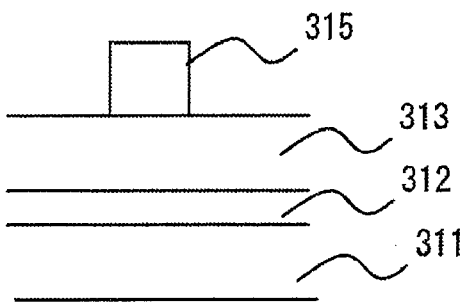
FIG. 4 are schematic diagrams of the film structure for realizing the wiring structure of the semiconductor device which is the subject of the embodiment shown in FIG. 1.

Furthermore, a photoresist 315 composed of an organic material such as a resin to be the mask on processing the oxide film 314 may be placed over them. FIG. 4 show the case where the material of the patterned film 315 to be the mask is a resist mask.

Figure 3B:
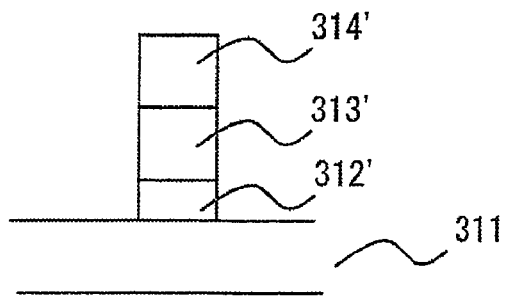
Figure 4B:
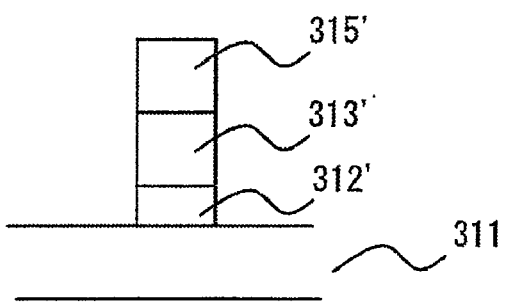

In the case of such a film structure, after the oxide film 314 is etched with the photoresist 315 as the mask, the gate film 313 and high-k film 312 placed further underneath are etched with the shape of the processed oxide film 314 as the mask. The shapes after the processing are shown in FIG. 3B and FIG. 4B respectively.

Figure 5:
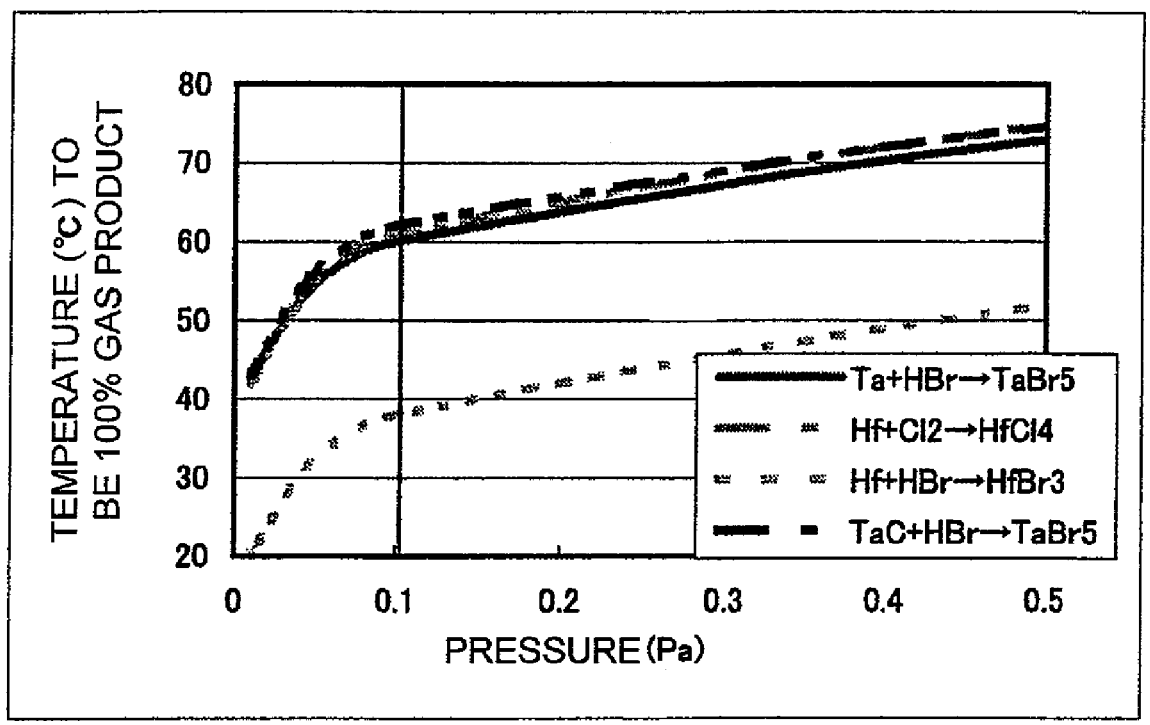
FIG. 5 is a graph showing a condition in the case of processing the film structure shown in FIG. 3 or FIG. 4 on the plasma processing apparatus according to the embodiment shown in FIG. 1, which shows the effects of change in processing temperature against change in pressure in the processing room.

FIG. 5 is a graph showing a condition in the case of processing the film structure shown in FIG. 3 or FIG. 4 on the plasma processing apparatus shown in FIG. 1, which shows the effects of change in processing temperature against change in pressure in the processing room. FIG. 5 shows (1) the case where an HBr gas reacts when a gate member is Ta, (2) the case where a $Cl_2$ gas reacts when the gate member is Hf, (3) the case where the HBr gas reacts when the gate member is Hf, and (4) the case where the HBr gas reacts when the gate member is TaC.

As shown in FIG. 5, in all the cases of (1) to (4), there is a drastic change in the temperature of the sample volatilized by the material constituting the film when the pressure in the processing room is 0.1 Pa or less. To be more specific, lower limit temperature of a sample surface capable of volatilizing the products at a predetermined ratio is 0.1 Pa or less. In particular, it drastically drops at the pressure of 0.06 Pa or less. Especially, it drastically changes to 60° C. or less in the cases of (1), (2) and (4).

If the temperature of the semiconductor wafer 212, i.e. the temperature of the bottom electrode exceeds 60° C. in the case where the bottom electrode base material 211 is aluminum and the dielectric film 214 is alumina, a linear expansion coefficient of aluminum is $2.3 \times 10^{-5}$ (1/° C.) while a linear expansion coefficient of alumina is $7.1 \times 10^{-6}$ (1/° C.) so that a dimension difference of approximately 0.2 mm arises when electrode temperature is 65° C. and a temperature difference is 45° C. To acquire stress based on this, it is $1 \times 10^5$ g/mm², which exceeds allowable stress $5 \times 10^4$ g/mm and causes damage. Thus, use in excess of 60° C. requires a structural change such as change of the material for a mechanical reason. As a material of a low linear expansion coefficient deteriorates thermal responsiveness, there arises a temperature rise due to plasma heat input.

In the case of performing the processing with the sample surface at 60° C. or more, deterioration of the resist mask becomes so significant that processing accuracy lowers as to the shape of the lower film using it as the mask. In the case of a photoresist composed of a hydrocarbon material in particular, deformation and softening thereof becomes significant. And if the power of the bias supplied to the electrode of the sample stage is increased to raise the temperature, selectivity between the resist and the lower film lowers so that side etching increases and the processing accuracy is reduced.

Thus, this embodiment processes the sample by maintaining the inside of the processing room at the pressure of 0.1 Pa or less or preferably 0.06 Pa or less so as to realize the condition of the processing for suppressing the problem. To be more specific, it is possible, by setting the sample surface at 60° C. or less while maintaining the pressure condition, to perform the processing with improved reactivity of the film material and at improved processing speed. In addition, it is possible to suppress the deterioration of the resist mask so as to balance the above with improvement in the processing accuracy.

As for the range of such a condition, the lower limit of pressure is 0.025 Pa or preferably 0.03 Pa in view of exhaustion efficiency, and the lower limit of temperature for achieving a predetermined volatilization volume in this case is 45° C. The action and effects can be exerted by performing the processing in an area of 60° C. or less above a line segment connecting a point of 0.025 Pa, 45° C. with a point of 0.1 Pa, 60° C. in FIG. 5.

To be more precise, the range of a suitable condition for the processing is the range of T=60° C. or less above the line at which a temperature T of the sample or the sample stage 112 is per following (1). This embodiment can increase flexibility in selection and setup of recipes of sample processing by expanding the range of the pressure and temperature capable of realizing such a processing condition.

$$T = 200P + 40 \qquad (1)$$

T: temperature (° C.)
P: pressure (Pa)

Furthermore, according to this embodiment, the temperature of the members facing the plasma in the processing room such as the inner wall member 124 and the internal chamber 126 of the discharge room is maintained by keeping the temperature of the sample stage 112 or the sample high so as to perform the processing. In this case, as shown in FIG. 5, the pressure in the processing room is kept at 0.1 Pa or less to increase volatility of the reaction products generated in the processing room, which suppresses the reattachment of the products to the surfaces in the processing room and generation of foreign substances due to deposition thereof.

The temperature of the members placed in the processing room and facing the plasma is regulated to be equal to or higher than the temperature of the surface facing the plasma of the sample in process put on the sample stage so as to prevent the products generated in conjunction with the processing from attaching to the surface of the members in the processing room and accumulating thereon. According to this embodiment, the heater 134 is placed, which is mounted covering and contacting the circumference of a lateral wall surface of the discharge room outer wall member 123 in order to regulate the temperature of such members in the processing room. The heat generated by the operation of the heater 134 is transmitted to the inside of the processing room to adjust the temperature of the surface of the member in the processing room such as the inner wall member 124 to be higher than the surface of the semiconductor wafer 212 which is the sample.

In this case, if the temperature of the sample surface is exceeding high temperature such as 60° C., it is necessary to set the temperature of the inner wall member 124 in the processing room at this or higher temperature so that the temperature of the heater 134 becomes even higher. Thus, it requires means for securing safety, for instance, by covering the processing room outer wall surface with a heat insulating member or the like so that there is little danger even if a user or a worker touches this heated portion. Therefore, the structure becomes further complicated, and space for installation thereof is also necessary, resulting in increased costs for installation and operation.

According to this embodiment, the processing device sets the temperature of the sample in process at 60° C. or preferably 50° C. or less and performs the processing by regulating the temperature of the inner walls of the processing room to be higher than this so as to lower operating temperature of a heating device compared with the conventional device and eliminate necessity of the heat insulating member or the like of the processing room. In this case, it is possible, by reducing the pressure of the sample in process to 0.1 Pa or less or preferably 0.06 Pa, or more preferably 0.05 Pa or less, to process the sample surface in process at the above temperature or less when processing the film structure including the film composed of high-melting metal materials shown in FIG. 3. Thus, it is possible to reduce generation of foreign substances during the processing and suppress the yield by using the processing device of a simpler structure.

To realize the low pressure of 0.1 Pa or less, the distance from discharge space on the wafer to the pump for exhaustion must be minimized in order to enhance the conductance thereof. In this case, it is best to put the bottom electrode at the center of the chamber as in FIG. 1. It is desirable, however, to set the electrode temperature at 60° C. or less also in view of allowable temperature limit of a cylinder and a sensor used for a boosting mechanism for transport which is not shown.

As in the drawings, in the case of processing Hf, a conventional device was capable of the processing at low temperature by using HBr as etching gas. It becomes possible, by rendering the pressure low, to perform etching with the Cl2 gas at 60° C. or less. Thus, the range of choice of the gases for etching is expanded, and it becomes possible to variously control other processed shapes.

What is claimed is:

1. A plasma processing method comprising placing a sample having a layer of a high-melting metal film on the surface thereof in a vacuum vessel and processing it by generating a plasma in the vacuum vessel, wherein:

the sample is processed under conditions that the temperature (T) of the sample is equal to or less than 60° C. and a pressure (P) in the vacuum vessel is equal to or less than 0.1 Pa, and the sample also includes a film underneath the metal film, which is made of a high-k film material including Hf, and wherein T is more than 200P+40, and wherein a surface temperature of walls of the vacuum vessel is higher than a temperature of the sample in the vacuum vessel.

2. The plasma processing method according to claim 1, wherein:

the sample is put on an insulating film composed of ceramics of a sample stage placed in the vacuum vessel and including a base material made of aluminum or an alloy thereof and the insulating film placed on a surface thereof; and temperature of the sample is regulated to 60° C. or less by temperature regulating means placed in the base material.

3. The plasma processing method according to claim 1, wherein the pressure (P) is 0.06 Pa or less.

4. The plasma processing method according to claim 1, wherein said pressure (P) is at least 0.025 Pa, and said temperature of said sample is at least 45° C.

5. The plasma processing method according to claim 1, wherein the high-melting metal film is composed of a simple substance or a compound or a chemical compound of multiple substances out of Ti, Ni, Mo, Ru, Hf, Ta, W, Re, Ri, Pt, La, Eu and Yb.

6. The plasma processing method according to claim 5, wherein:

the sample is put on an insulating film composed of ceramics of a sample stage placed in the vacuum vessel and including a base material made of aluminum or an alloy thereof and the insulating film placed on a surface thereof; and temperature of the sample is regulated to 60° C. or less by temperature regulating means placed in the base material.

7. The plasma processing method according to claim 5, wherein Cl or HBr is supplied into the vacuum vessel and a film for a gate is etched to form a gate structure.

* * * * *